United States Patent [19]

Okikawa et al.

[11] Patent Number: 4,845,543
[45] Date of Patent: Jul. 4, 1989

[54] SEMICONDUCTOR DEVICE AND METHOD OF MANUFACTURING THE SAME

[75] Inventors: Susumu Okikawa, Ohme; Hiroshi Mikino, Tachikawa; Hiromichi Suzuki, Tokyo; Wahei Kitamura, Kodaira; Daiji Sakamoto, Yonago, all of Japan

[73] Assignee: Hitachi, Ltd., Tokyo, Japan

[21] Appl. No.: 67,969

[22] Filed: Jun. 29, 1987

Related U.S. Application Data

[63] Continuation-in-part of Ser. No. 937,999, Dec. 4, 1986, abandoned, which is a continuation of Ser. No. 704,827, Feb. 25, 1985, abandoned, which is a continuation-in-part of Ser. No. 655,626, Sep. 28, 1984, abandoned.

[30] Foreign Application Priority Data

| Sep. 28, 1983 | [JP] | Japan | 58-177945 |
| Sep. 28, 1983 | [JP] | Japan | 58-177944 |
| Feb. 24, 1984 | [JP] | Japan | 59-32433 |
| Feb. 24, 1984 | [JP] | Japan | 59-32434 |
| Feb. 24, 1984 | [JP] | Japan | 59-32435 |

[51] Int. Cl.$^4$ .................................... H01L 23/48
[52] U.S. Cl. ........................... 357/67; 357/65; 357/68; 357/70
[58] Field of Search ............ 420/528, 542, 546, 550; 357/65, 67, 68, 70

[56] References Cited

U.S. PATENT DOCUMENTS

| 1,227,174 | 5/1917 | Morris | 420/550 |
| 2,186,394 | 1/1940 | Spitaler | 420/546 |
| 3,353,073 | 11/1967 | Majima et al. | 420/542 X |
| 3,397,044 | 8/1968 | Bylund | 420/550 X |
| 3,899,723 | 8/1975 | Mühlhaüsser et al. | 420/528 X |
| 3,951,764 | 4/1976 | King | 420/528 X |
| 4,082,222 | 3/1978 | Schderner et al. | 148/2 |
| 4,171,215 | 10/1979 | Dremann | 420/528 X |
| 4,355,082 | 10/1982 | Bischoff et al. | 428/607 |

FOREIGN PATENT DOCUMENTS

0088557 9/1983 European Pat. Off. .
0101299 2/1984 European Pat. Off. .

(List continued on next page.)

OTHER PUBLICATIONS

*Aluminium-Taschenbuch*, Aluminium-Verlag Dusseldorf, 1983, pp. 231-234, 939, 1000-1002.
"Corrosion Resistant Aluminum Above 200° C.", by J. E. Draley and W. E. Ruther, Argonne National Labs Publication An-5430, Jul. 15, 1955.
Streetman, Ben G., *Solid State Electronic Devices*, Prentice Hall, 1980, pp. 368-371.

*Primary Examiner*—Andrew J. James
*Assistant Examiner*—Sara W. Crane
*Attorney, Agent, or Firm*—Antonelli, Terry & Wands

[57] ABSTRACT

A semiconductor device in which a pellet and external leads are connected by bonding wires made of aluminum containing a predetermined amount of at least one additive element, the bonding wires containing 0.05 to 3.0 weight % of at least one element selected from the group consisting of iron and palladium, or containing 0.05-3.0 weight % of at least one first element selected from the group consisting of nickel, iron and palladium and 0.05-3.0 weight % of at least one second element selected from the group consisting of magnesium, manganese and silicon, whereby the corrosion resistance of the wire is increased and the breaking strength of the wire is enhanced. The bonding wires can be connected to the semiconductor pellet by a ball bond, and it is disclosed that using a ball having a Vickers hardness of 30-50 enables good bonding of the bonding wire to, e.g., an aluminum pad on the semiconductor pellet to be achieved. A ball having such hardness can be provided by using specific aluminum alloy compositions and by a quenching of the ball. The bonding wire has the shape and height of its loop controlled by annealing the bonding wire at a specified temperature before bonding or by employing a specified composition for the material of the bonding wire. The loop shape and bondability of the bonding wire, which can be made of aluminum or an aluminum composition containing, e.g., about 1.5 weight % of magnesium, are controlled into the best states.

26 Claims, 9 Drawing Sheets

FOREIGN PATENT DOCUMENTS

| | | |
|---|---|---|
| 1297872 | 6/1969 | Fed. Rep. of Germany . |
| 2143808 | 3/1973 | Fed. Rep. of Germany . |
| 571265 | 12/1975 | Fed. Rep. of Germany . |
| 2655433 | 6/1977 | Fed. Rep. of Germany . |
| 2625092 | 12/1977 | Fed. Rep. of Germany . |
| 2435456 | 2/1978 | Fed. Rep. of Germany . |
| 2537804 | 7/1978 | Fed. Rep. of Germany . |
| 2929623 | 1/1981 | Fed. Rep. of Germany . |
| 3209242 | 11/1982 | Fed. Rep. of Germany . |
| 2240504 | 3/1975 | France . |
| 2335020 | 7/1977 | France . |
| 50-70895 | 6/1975 | Japan . |
| 52-51867 | 4/1977 | Japan . |
| 58-124235 | 7/1983 | Japan ................................... 357/65 |
| 0367831 | 2/1932 | United Kingdom ................ 420/546 |

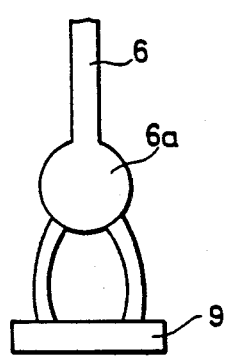
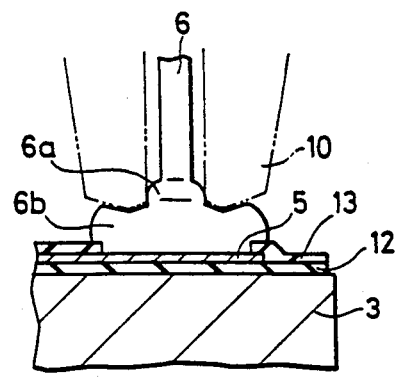
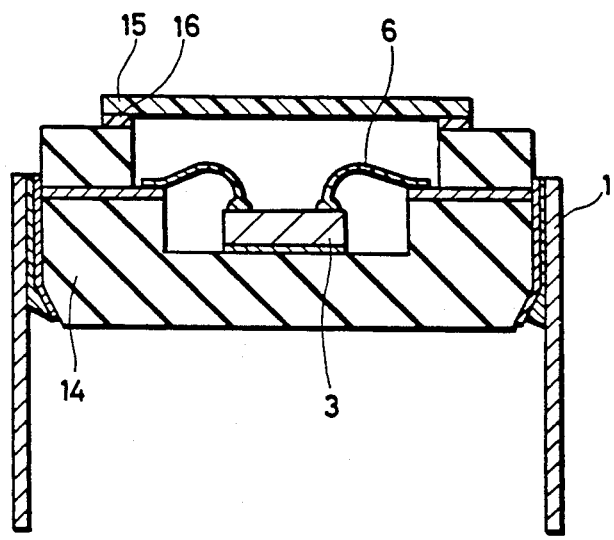

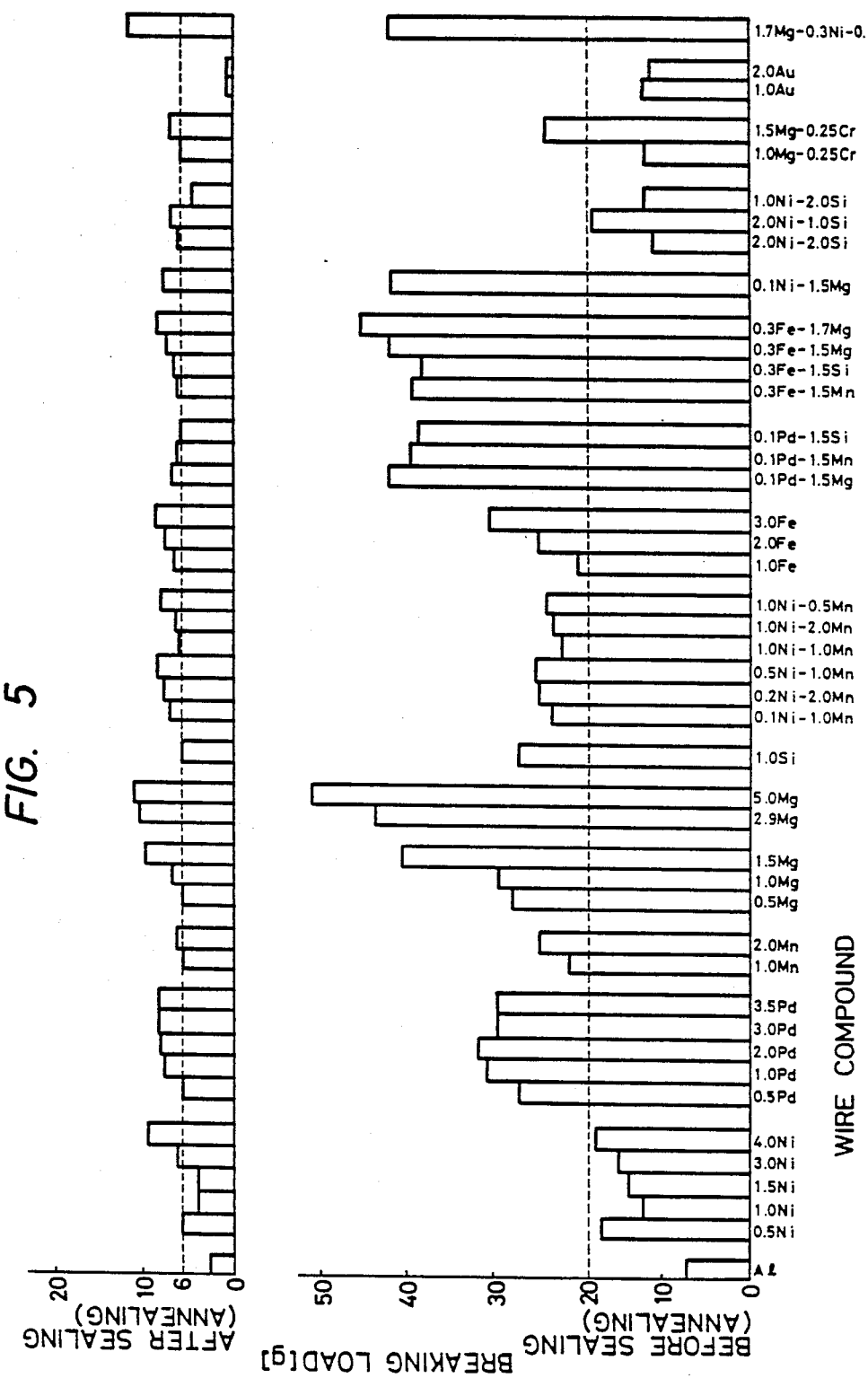

SEMICONDUCTOR DEVICE AND METHOD OF MANUFACTURING THE SAME

This application is a continuation-in-part application of Ser. No. 937,999, filed Dec. 4, 1986, abandoned which is a continuation application of Ser. No. 704,827, filed Feb. 25, 1985, abandoned and is a continuation-in-part application of Ser. No. 655,626, filed Sept. 28, 1984 abandoned.

BACKGROUND OF THE INVENTION

The present invention relates to a semiconductor device; and, more particularly, relates to a semiconductor device employing wires (e.g., bonding wires, for electrical connection between bonding pads of a pellet and a conductive portion for external lead-out) of aluminum or an aluminum alloy, and to techniques which are effective when applied to the bonding wire, and to the device formed by such techniques.

In the process of producing a semiconductor device, a gold (Au) wire is used as a wire which electrically connects the aluminum bonding pad of a semiconductor pellet and a base plate such as the base of a lead frame or a ceramic package. Usually, the gold wire is formed with a ball at an end thereof and then subjected to ball bonding by thermocompression.

Utilizing aluminum as the material of the wire has been considered in order to eliminate the disadvantage resulting from an increase in the cost attributed to the use of gold. Formation of a ball at an end of the aluminum wire by an electric torch or the like, whereupon a ball bonding is performed, is disclosed in Japanese Laid-Open Patent Application No. 51-140567. Thus, Japanese Laid-Open Patent Application No. 51-140567 discloses a semiconductor device wherein a ball is formed at the distal end of an aluminum wire by an electric torch or the like so as to effect ball bonding.

Although the aluminum wire is low in cost, it is inferior in its corrosion resistance. Especially when applied to the so-called resin-molded package, the wire corrodes to degrade the reliability of the device. Another problem is that the aluminum wire is lower in mechanical strength as compared with a gold wire.

SUMMARY OF THE INVENTION

As to the ball bonding of the aluminum wire, it has been found in accordance with the present invention, that the peeling of the bonding wire occurs particularly on the bonding pad side of the pellet, so that the bonding performance degrades.

In accordance with the present invention, it has also been found that the hardness of the ball portion used for forming the bond, in the case of forming the ball portion in the aluminum wire, exerts great influence on bonding performance. More specifically, when the ball portion is too soft at the step of forming the aluminum ball, e.g., due to annealing, ultrasonic energy does not sufficiently act on a bonding portion in subjecting the aluminum film of the bonding pad and the ball portion of the aluminum wire to the ultrasonic bonding. For this reason, a plane of aluminum having an active surface energy state is not exposed, so that the peeling of the bonding wire occurs. On the other hand, when the aluminum ball is too hard, a force at the step of bonding exerts great forces on a silicon layer, a silicon dioxide layer, etc., which underlie the aluminum pad. For this reason, these layers undergo bonding damages such as cracks and the like.

Upon conducting studies on the basis of the aforementioned knowledge, in accordance with the present invention, compositions of an aluminum wire which can effectively provide the required ball bonding while effectively preventing the corrosion of the aluminum wire has been found.

Meanwhile, the following relationship between the bondability and the hardness of the entire aluminum wire has been discovered by the inventors and is unlike that for only the ball; when the hardness of the entire aluminum wire is too low, the aluminum ball collapses excessively or a capillary gets clogged with the wire in a bonding operation employing bonding equipment, for example, an ultrasonic wire bonder. Conversely, with an aluminum wire whose hardness is too high, it is sometimes the case that the height of a wire loop becomes much greater than the desired value thereof. When, with the intention of preventing this drawback, a back tension is exerted on the wire, the wire breaks.

It has also been found by the inventors that the heat treatment conditions of a raw wire; namely, the wire as it is formed and not yet subjected to any treatment, have an important relationship to the aforementioned problems and that the loop height of the wire can be restrained within a desired value by controlling the heat treatment conditions.

It has also been found that, in the case of ball-bonding the aluminum wire, deterioration in the strength of the wire can take place due to a high temperature which is received at, e.g., the heating of a low-melting glass for sealing the package, so the reliability of the semiconductor device is caused to be lower.

Further, it has been found, in accordance with this invention, that when the wire has an improper strength during bonding, the bonding operation becomes difficult, so that a poor loop shape, or a too high or too low loop, is formed, which provide causes for the breaking and flow of the wire, short-circuit, etc.

Moreover, making further studies on the basis of the aforementioned knowledge, in accordance with this invention a technique has been developed which can properly hold the strength of the aluminum wire while preventing the corrosion thereof.

An object of the present invention is to provide a wire composition which can increase the corrosion resistance of an aluminum wire (e.g., an aluminum composition for use as the wire) and can enhance the reliability of a semiconductor device.

Another object of the present invention is to provide a wire composition which can increase not only the corrosion resistance, but also the mechanical strength of an aluminum wire, and can enhance the reliability of a semiconductor device more.

Another object of the present invention is to provide a wire composition, and technique of treating the wire, according to which, in performing ball bonding with a wire made of a corrosion-proof aluminum alloy, the hardness of the ball portion is set within an optimum range, whereby a favorable bonding performance can be attained.

Another object of the present invention is to provide an aluminum wire having a composition that prevents corrosion and that permits ball bonding to proceed optimally, and a technique for treating the wire.

Another object of the present invention is to provide a wire composition which can secure sufficient wire strength and can enhance reliability.

Still another object of the present invention is to provide a bonding wire which can prevent corrosion and can attain a sufficient strength.

Another object of the present invention is to provide a method which can restrain the loop height of a bonding wire within a desired value thereof.

Another object of the present invention is to provide a method which ca prevent a wire from breaking and which enhances the available percentage of bonding.

Another object of the present invention is to provide a method which can prevent the occurrence of wire breakdown, etc.

Still another object of the present invention is to provide a wire and a bonding method with which both the hardness of the bonding wire itself and that of a ball part can be set at the optimum conditions.

The typical aspects of the present invention will be briefly set forth.

An aluminum wire of the present invention contains at least one element which is selected from the group consisting of 0.05–3.0 weight % of iron and 0.05–3.0 weight % of palladium.

In addition, an aluminum wire of the present invention contains at least one element which is selected from the group consisting of 0.05–3.0 weight % of nickel, 0.05–3.0 weight % of iron and 0.05–3.0 weight % of palladium, and at least one element which is selected from the group consisting of 0.5–3.0 weight % of magnesium, 0.5–3.0 weight % of manganese and 0.5–3.0 weight % of silicon.

In addition, an aluminum wire of the present invention contains nickel, and the Vickers hardness of a ball portion thereof is 30–50, particularly 35–45.

Further, the breaking strengths of an aluminum wire before and after the sealing of a package are, respectively, set at appropriate values.

By heat-treating a wire, it becomes possible to set the hardness of the wire at a desired value and to restrain a wire loop height within the rating thereof.

The wire loop height can be restrained within the rating by selecting a specified composition for the material of the wire.

A favorable bondability is attained by selecting in a specified range the hardness of a ball part which is formed in an aluminum wire or aluminum composition wire.

The above-mentioned and other objects and novel features of the present invention will become apparent from the description of this specification and the accompanying drawings.

BRIEF DESCRIPTION OF THE DRAWINGS

FIGS. 3 and 4 are schematic views showing the formation of a ball in an aluminum-based wire and the ultrasonic bonding state thereof, respectively;

FIG. 5 is a diagram showing the relationships between the compositions of wires and the breaking loads thereof;

FIG. 6 is a sectional view of a semiconductor device which is an embodiment of the present invention;

DESCRIPTION OF THE PREFERRED EMBODIMENTS

Figure 1:
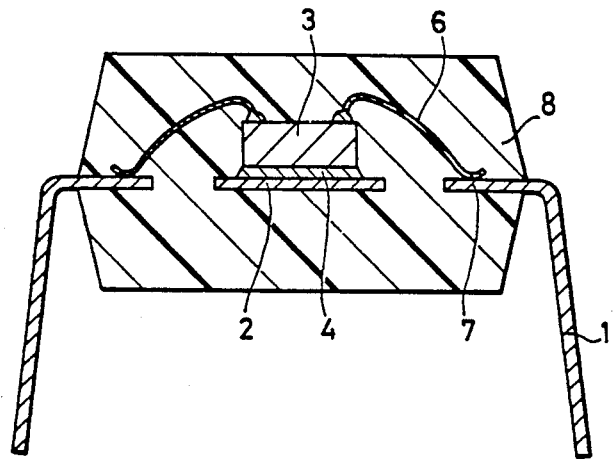
FIG. 1 is a sectional view of a semiconductor device which is one embodiment of the present invention.

In a semiconductor device shown in FIG. 1, a pellet or chip 3 of, e.g., silicon, is mounted on a tab 2 of, e.g., a 42 alloy by a joint layer 4 which is made of, e.g., a gold-silicon eutectic or a binder such as silver paste.

Figure 2:
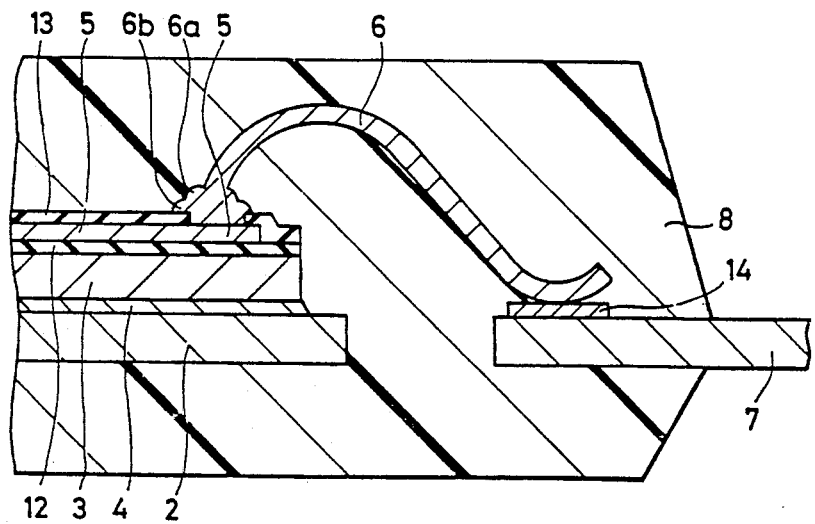
FIG. 2 is an enlarged partial sectional view of a wire bonding portion in the semiconductor device of FIG. 1.

The bonding pad of the pellet 3 is formed of an aluminum pad 5 as shown in FIG. 2.

On the other hand, a bonding wire 6 is an aluminum-based wire which is made of aluminum or aluminum composition (e.g., aluminum alloy). The bonding wire 6 is used for electrically connecting the aluminum pad 5 of the pellet 3 with an aluminum layer 14 which is formed on the inner lead portion 7 of an external lead 1 of, e.g., a 42 alloy.

After the wire bonding has been completed, the pellet 3, the bonding wire 6, etc., are molded by the use of a plastic resin 8.

In bonding the bonding wire 6, according to the present embodiment, as illustrated in FIG. 3, a ball portion 6a is formed at the distal end of the wire 6 by an electric discharge between the distal end of the wire 6 held by a wire bonder, not shown, and the electrode 9 of the wire bonder. By specifying the material of the wire as described hereinafter, the ball portion 6a has a hardness suited to the bonding.

Immediately after the ball portion 6a has been formed, it may well be quenched by blowing an inert gas, for example, argon, at a low temperature, against it. Thus, a favorable ball hardness is attained. Whatever composition the wire may have, the quenching is one of the good expedients for attaining a predetermined hardness.

Using an ultrasonic bonding tool 10 as shown in FIG. 4 by way of example, the ball portion 6a is pressed against the aluminum pad 5 on the pellet 3 and is firmly bonded by ultrasonic oscillations. An $Al_2O_3$ film produced at the surface of the ball portion 6a is broken at the bonding, and a favorable wire connection is performed. The ball portion 6a is depressed to form a bonding portion 6b. The bonding portion 6b covers the aluminum pad 5 which is exposed from the opening of a final passivation film 13.

The wire 6 of the present embodiment is made of an aluminum composition (e.g., aluminum alloy) in which, in order to enhance the moisture resistance, the principal ingredient of aluminum has at least one element added thereto; the added element or elements being selected from the group consisting of 0.05-3.0 weight % of iron (Fe) and 0.05-3.0 weight % of palladium (Pd).

The reason why the moisture resistance of the wire can be enhanced by containing at least one element selected from the group consisting of iron and palladium at the predetermined proportion in the aluminum wire, is as stated hereinafter.

In a high temperature and high humidity test such as MIL883B which is a typical test method of the corrosion resistance, the hydrogen of a water content $H_2O$ becomes atomic hydrogen H. Since the atomic hydrogen H is small, it permeates the grain boundary of aluminum easily. When the hydrogen atoms H react together into gaseous hydrogen $H_2$, the volume expands to spread the grain boundary. Corrosion proceeds from the spread apart grain boundary. On the other hand, in the aluminum wire which contains iron or palladium, the bonding reaction of the atomic hydrogen H is promoted by the catalytic action of the iron or palladium contained in the crystal grain of aluminum. As a result, the atomic hydrogen H becomes gaseous hydrogen $H_2$ at the surface of the aluminum without permeating the grain boundary thereof. Accordingly, the wire becomes difficult to corrode. In other words, it is considered that the occlusion of $H_2$ into the aluminum alloy wire is suppressed by the action of the iron or palladium, so the grain boundary corrosion will be prevented.

The inventors have conducted an experiment on the relations between the compositions of wires and the properties thereof, and the results are set forth in Table 1.

The leftmost column in Table 1 indicates the compositions of the aluminum wires. For example, "Al—0.05 Fe" denotes an aluminum wire which contains 0.05 weight % of Fe and a balance of Al. The other columns indicate, at respective test periods of time, the cumulative numbers of samples which corroded when 10 samples of each wire were let stand at 121° C. under a steam pressure of 2 atmospheres. The aluminum used was one having a purity of 99.999 weight %.

TABLE 1

| Composition | Period of Time (hr) | | | | | | | |
|---|---|---|---|---|---|---|---|---|
| | 20 | 40 | 60 | 80 | 100 | 200 | 400 | 600 |
| Al | 2 | 10 | — | — | — | — | — | — |
| Al—0.05 Fe | 2 | 5 | 10 | — | — | — | — | — |
| Al—0.1 Fe | 0 | 0 | 0 | 0 | 0 | 2 | 3 | 4 |
| Al—0.5 Fe | 0 | 0 | 0 | 0 | 0 | 0 | 0 | 0 |
| Al—1.0 Fe | 0 | 0 | 0 | 0 | 0 | 0 | 0 | 0 |

TABLE 1-continued

| Composition | Period of Time (hr) | | | | | | | |
|---|---|---|---|---|---|---|---|---|
| | 20 | 40 | 60 | 80 | 100 | 200 | 400 | 600 |
| Al—2.0 Fe | 0 | 0 | 0 | 0 | 0 | 0 | 0 | 0 |
| Al—3.0 Fe | 0 | 0 | 0 | 0 | 0 | 0 | 0 | 0 |
| Al—0.05 Pd | 0 | 0 | 0 | 0 | 0 | 1 | 3 | 4 |
| Al—0.1 Pd | 0 | 0 | 0 | 0 | 0 | 0 | 0 | 0 |
| Al—0.5 Pd | 0 | 0 | 0 | 0 | 0 | 0 | 0 | 0 |
| Al—1.0 Pd | 0 | 0 | 0 | 0 | 0 | 0 | 0 | 0 |
| Al—2.0 Pd | 0 | 0 | 0 | 0 | 0 | 0 | 0 | 0 |
| Al—3.0 Pd | 0 | 0 | 0 | 0 | 0 | 0 | 0 | 0 |

It is understood from the data in Table 1 that the corrosion resistance of the aluminum wire is improved by adding iron or palladium. With the content of iron amounting to 0.05 weight %, a great improvement is not expected. This is because the catalytic action is insufficient due to the small amount of iron contained therein. Palladium is more effective for providing improvement than iron. The aluminum wire containing at least 0.5 weight % of iron or at least 0.1 weight % of palladium does not corrode even when 600 hours have elapsed.

Advantageously, it has been found that the mechanical strength of the aluminum wire can be increased simultaneously with the corrosion resistance of the wire.

For this purpose, the wire 6 is formed of an aluminum composition (e.g., aluminum alloy) which contains at least one first element selected from the group consisting of 0.05-3.0 weight % of nickel, 0.05-3.0 weight % of iron and 0.05-3.0 weight % of palladium, and at least one second element selected from the group consisting of 0.5-3.0 weight % of magnesium, 0.5-3.0 weight % of manganese and 0.5-3.0 weight % of silicon.

Nickel increases the moisture resistance of the aluminum wire for the same reason as that of iron or palladium. The grain boundary corrosion of the aluminum wire can be prevented by adding the nickel in the heretofore described proportions.

The data in Table 2 show that, when aluminum wires contain nickel, the corrosion resistances thereof are improved. The manner of indicating the content of the additive element or elements in this table and the test method used are the same as those used in the experiments reported in Table 1. The purity of the aluminum again was 99.999% by weight.

It is understood from Table 2 that the aluminum wire has its corrosion resistance improved by the addition of nickel.

TABLE 2

| Composition | Period of Time (hr) | | | | | | | | |
|---|---|---|---|---|---|---|---|---|---|
| | 10 | 20 | 30 | 40 | 50 | 100 | 200 | 300 | 500 |
| Al | 0 | 2 | 6 | 10 | — | — | — | — | — |
| Al—0.01 Ni | 0 | 0 | 5 | 8 | 10 | — | — | — | — |
| Al—0.02 Ni | 0 | 0 | 0 | 0 | 2 | 5 | 10 | — | — |
| Al—0.03 Ni | 0 | 0 | 0 | 0 | 0 | 5 | 10 | — | — |
| Al—0.04 Ni | 0 | 0 | 0 | 0 | 0 | 0 | 5 | 10 | — |
| Al—0.05 Ni | 0 | 0 | 0 | 0 | 0 | 0 | 0 | 2 | 5 |
| Al—0.075 Ni | 0 | 0 | 0 | 0 | 0 | 0 | 0 | 0 | 0 |
| Al—0.10 Ni | 0 | 0 | 0 | 0 | 0 | 0 | 0 | 0 | 0 |
| Al—1.0 Ni | 0 | 0 | 0 | 0 | 0 | 0 | 0 | 0 | 0 |
| Al—2.0 Ni | 0 | 0 | 0 | 0 | 0 | 0 | 0 | 0 | 0 |
| Al—3.0 Ni | 0 | 0 | 0 | 0 | 0 | 0 | 0 | 0 | 0 |
| Al—4.0 Ni | 0 | 0 | 0 | 0 | 0 | 0 | 0 | 0 | 0 |
| Al—0.05 to 2.0 Mg | 0 | 2 | 2 | 5 | 10 | — | — | — | — |
| Al—1.5 Mg—0.1 Ni | 0 | 0 | 0 | 0 | 0 | 0 | 0 | 0 | 0 |
| Al—1.0 Mn—0.1 Ni | 0 | 0 | 0 | 0 | 0 | 0 | 0 | 0 | 0 |
| Al—1.0 Mg—0.1 Fe | 0 | 0 | 0 | 0 | 0 | 0 | 5 | 10 | — |

TABLE 2-continued

| Composition | Period of Time (hr) | | | | | | | | |
|---|---|---|---|---|---|---|---|---|---|
| | 10 | 20 | 30 | 40 | 50 | 100 | 200 | 300 | 500 |
| Al—1.5 Mg—0.25 Gr | 0 | 10 | — | — | — | — | — | — | — |

Substance other than nickel, for example, magnesium and chromium alone are not effective for the improvement of the corrosion resistance. With the nickel content of 0.02 weight %, a great improvement is not shown. This is because the catalytic action is insufficient due to the small amount of nickel contained therein. The aluminum wire containing at least 0.075 weight % of nickel does not corrode even when 500 hours have elapsed.

As apparent from Tables 1 and 2, nickel is more effective for the improvement of the corrosion resistance than iron or palladium. As indicated in Table 2, the wire which contains nickel and one of magnesium and manganese is also excellent in the corrosion resistance. With magnesium only, the corrosion resistance is not improved. The wires containing nickel are excellent.

An aluminum wire containing any of nickel, iron and palladium has its mechanical strength increased by adding thereto any of magnesium, manganese and silicon in a predetermined proportion. The increase of the mechanical strength prevents defects such as disconnection and short-circuit attributed to the breaking of the wire, the flow of wire by injection of the resin, etc.

The diagrams in FIG. 5 indicate the strengths of various aluminum wires containing the aforementioned additives.

In FIG. 5, the axis of abscissas represents the wire compounds or the compositions of the wires. For example, "0.5 Pd" signifies a wire which is made of an alloy containing 0.5 weight % of Pd and a balance of Al. The axis of ordinates represents tensile forces or loads [g] at the times at which the wires pulled by a fixed force broke. The diameter of each of the wires was 30 μm. In addition, the lower graph or diagram of FIG. 5 indicates the initial strengths of the wires. The initial strength signifies the strength of the wire which was as drawn from an aluminum ingot, and which experienced no annealing. The upper graph of FIG. 5 indicates the strengths of the wires after annealing. Here, the "annealing" signifies that the wire 6 is subjected to a high temperature of 400°–500° C. for 2–10 minutes, by way of example. The breaking strength of the wire 6 lowers due to the annealing.

The inventors have elucidated that the initial breaking strength of the wire needs to be at least about 20 grams for the wire having the diameter of 30 microns.

The strength not lower than 20 grams is required when the aluminum ingot is drawn to form the aluminum wire, when the wire bonding is executed using the bonding tool 10 in FIG. 4, and so on. The wire whose strength is lower than 20 grams is liable to break.

According to the present invention, it has been found that the reliability of a semiconductor device is affected by the aforementioned fact that the strength of the wire is degraded by the annealing.

The annealing at 400°–500° C. for 2 to 10 minutes mentioned heretofore is unavoidable for semiconductor devices sealed with ceramic packages, including a semiconductor device shown in FIG. 6. That is, whatever sealant 16 may be used, the temperature and the period of time for the sealing are the same as or close to the temperatures and times noted.

For example, in a case where a low-softening point glass is employed as the sealant 16, the sealing conditions are 400°–500° C. and 2 to 10 minutes; in a case where glass frit sealing is adopted, the sealing conditions are 400°–500° C. and 2 to 10 minutes similarly; and in a case where gold-tin (Au-Sn) is used to seal the semiconductor device with a metal cap, the sealing conditions are 200°–300° C. and 2 to 10 minutes.

Thus, the aluminum wire is inevitably annealed. Whether the above temperature becomes the recrystallization point of the aluminum wire or a temperature close thereto depends also upon the composition of the wire.

According to the inventors' study, the strength of the wire before the annealing depends upon the workability and material or composition thereof. Besides, the strength of the wire after the annealing depends only upon the material thereof. It does not depend upon the hysteresis of the wire because the wire has been annealed at a temperature close to the recrystallization point. In addition, the breaking strength of the wire after annealing, i.e., after the sealing, needs to be at least 6 grams for the diameter of 30 μm. The wire whose strength is below 6 grams is liable to break.

In FIG. 6, reference numeral 14 designates a ceramic base and reference numeral 15 is a cap.

In the semiconductor device employing a ceramic package, the wire is selected by taking into consideration the wire strengths before and after the annealing. In a resin-molded semiconductor device, the temperature of the sealing is as comparatively low as about 170°–180° C., and hence, the wire strength lowers only to some extent after the sealing. Accordingly, the wire strength after the annealing does not often pose a problem. However, particularly when the reliability is rendered high, the strengths of the wire before and after the annealing should be considered.

When any of magnesium, manganese and silicon is further added to the aluminum wire containing any of nickel, iron and palladium, a wire of high corrosion resistance (the breaking strength of which is improved as indicated in FIG. 5) is produced.

As apparent from FIG. 5, especially the wire containing palladium or magnesium is high in the breaking strength. Also, the breaking strength is high when any of silicon, manganese and magnesium is contained in addition to palladium or magnesium. Particularly excellent are the aluminum wire containing iron and magnesium, the aluminum wire containing nickel and magnesium and the aluminum wire containing palladium and magnesium.

Regarding the aluminum wire containing 1.5 weight % of magnesium and 0.1 weight % of nickel (Al - 1.5 Mg - 0.1 Ni) and the aluminum wire containing 1.0 weight % of manganese and 0.1 weight % of nickel (Al - 1.0 Mn - 0.1 Ni) listed in Table 2, the former is higher in the breaking strength than the latter, though both are similarly excellent in corrosion resistance.

That is, the aluminum wire containing magnesium and nickel are excellent in both the corrosion resistance and breaking strength.

According to the present invention, it is recommended for setting the strength in a proper range that magnesium, manganese and/or silicon are contained in aluminum within a range of 0.5 weight % to 3.0 weight %.

In case of a wire which is made of a recrystallized material composition; namely, a wire which has been annealed at temperatures in a range from at least the recrystallization point of the wire to the recrystallization point plus 150° C. or so, a loop is formed very favorably and defects such as short-circuit between a tab and wires can be prevented from occurring; in addition to the fact that the breaking strength is enhanced.

Figure 7:
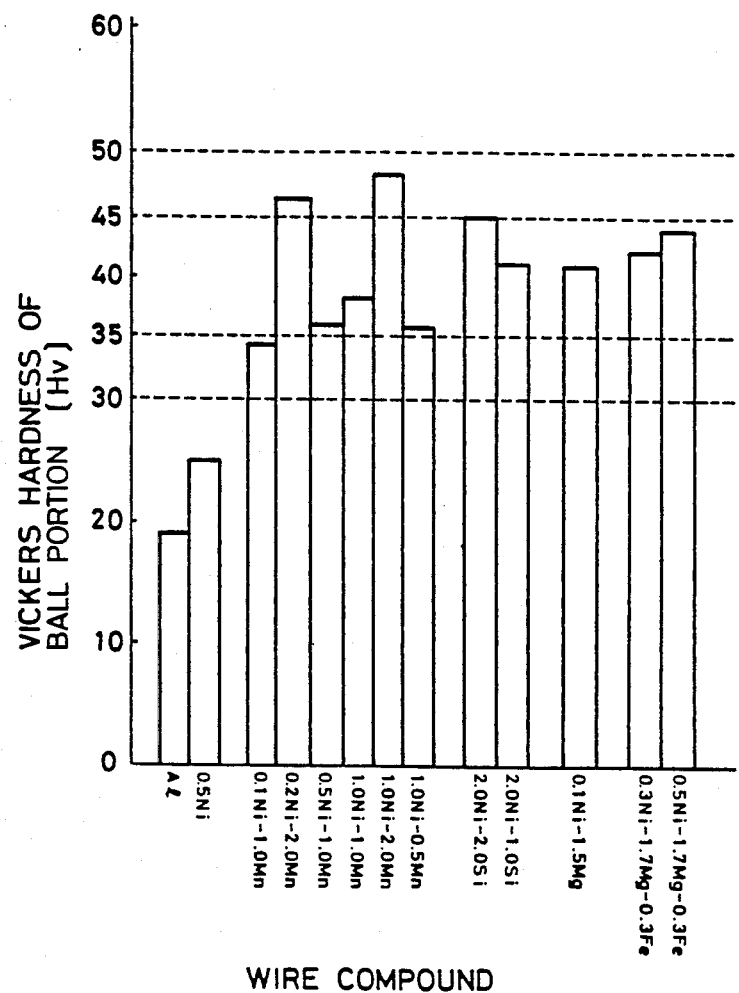
FIG. 7 is a diagram showing the relationships between the compositions of wires and the hardnesses of the bal portions of the wires.

When the wire 6 is an aluminum wire which contains nickel and any of magnesium, manganese and silicon, the Vickers hardness of the ball 6a becomes a value indicated in FIG. 7.

In FIG. 7, the axis of ordinates represents the Vickers hardness, and the axis of abscissas represents each wire alloy or the composition of each material. The Vickers hardness of each material is so indicated that the value of, e.g., Al is 18. Further, "0.5 Ni" indicates the wire made of Al containing 0.5 weight % of Ni.

When the hardness of the ball part 6a of the aluminum wire 6 is too low, the surface of aluminum which is active in a surface energy state does not appear, and the separation of the bonding wire from the pad occurs, as described before. On the other hand, when the hardness of the ball 6a is too high, forces occurring during the wire bonding operation give rise to bonding damage such that a silicon dioxide ($SiO_2$) layer 12 under the aluminum pad 5 is destroyed.

In order to attain a good bonding property, accordingly, the hardness of the aluminum ball part 6a needs to be set within a specific optimum range.

Figure 8:
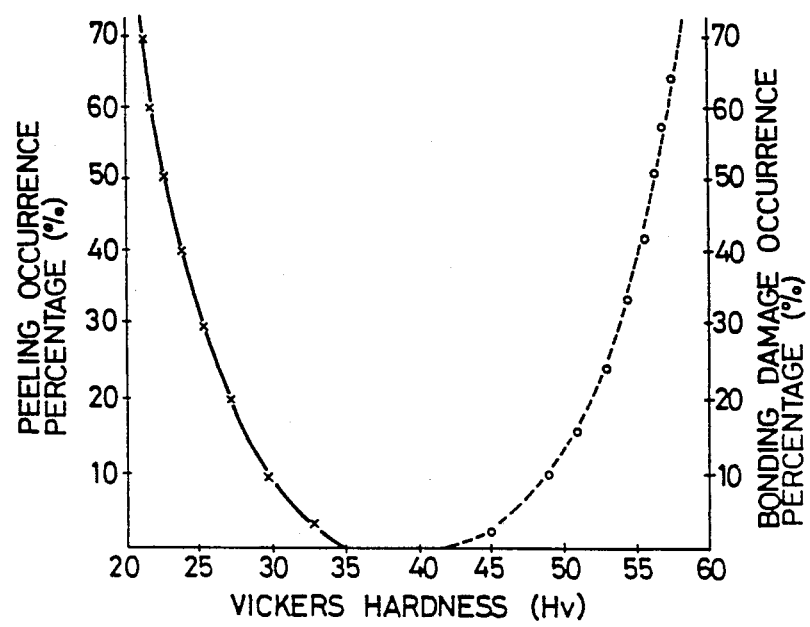
FIG. 8 is a diagram showing the bonding damage and peeling occurrence percentages versus the Vickers hardnesses of the ball portions of aluminum wires.

The inventors repeated experiments on the relationships to the hardness of the aluminum ball portion 6a, of the occurrence percentage of the peeling between the bonding wire 6 and the aluminum pad 5 and the bonding damage occurrence percentage by which cracks appear in a silicon dioxide layer 12 under the aluminum pad 5. The following results, as shown in FIG. 8, have been obtained.

A permissible value for the occurrence percentage of the bonding defects is about 10%. In view of this, it is seen from FIG. 8 what the peeling occurrence percentage (indicated by the curve with marks X) is high when the Vickers hardness is below about 30. In addition, the occurrence percentage of the bonding damages (indicated by the curve with marks 0) is high when the Vickers hardness is above about 50. Especially as the optimum range, a range of Vickers hardnesses 35-45 (more especially, 35-42) is selected.

That is, each wire 6 of the present embodiment is selected so that the Vickers hardness (Hv) of the ball at the ball bonding may fall within the range of 35-45 as indicated in FIG. 7 (more especially, 35-42).

The inventors conducted a large number of experiments under the same conditions in order to obtain the composition of the material of a wire which can provide the Vickers hardness within such optimum range. In this manner, the results shown in FIG. 9 have been obtained.

Figure 9:
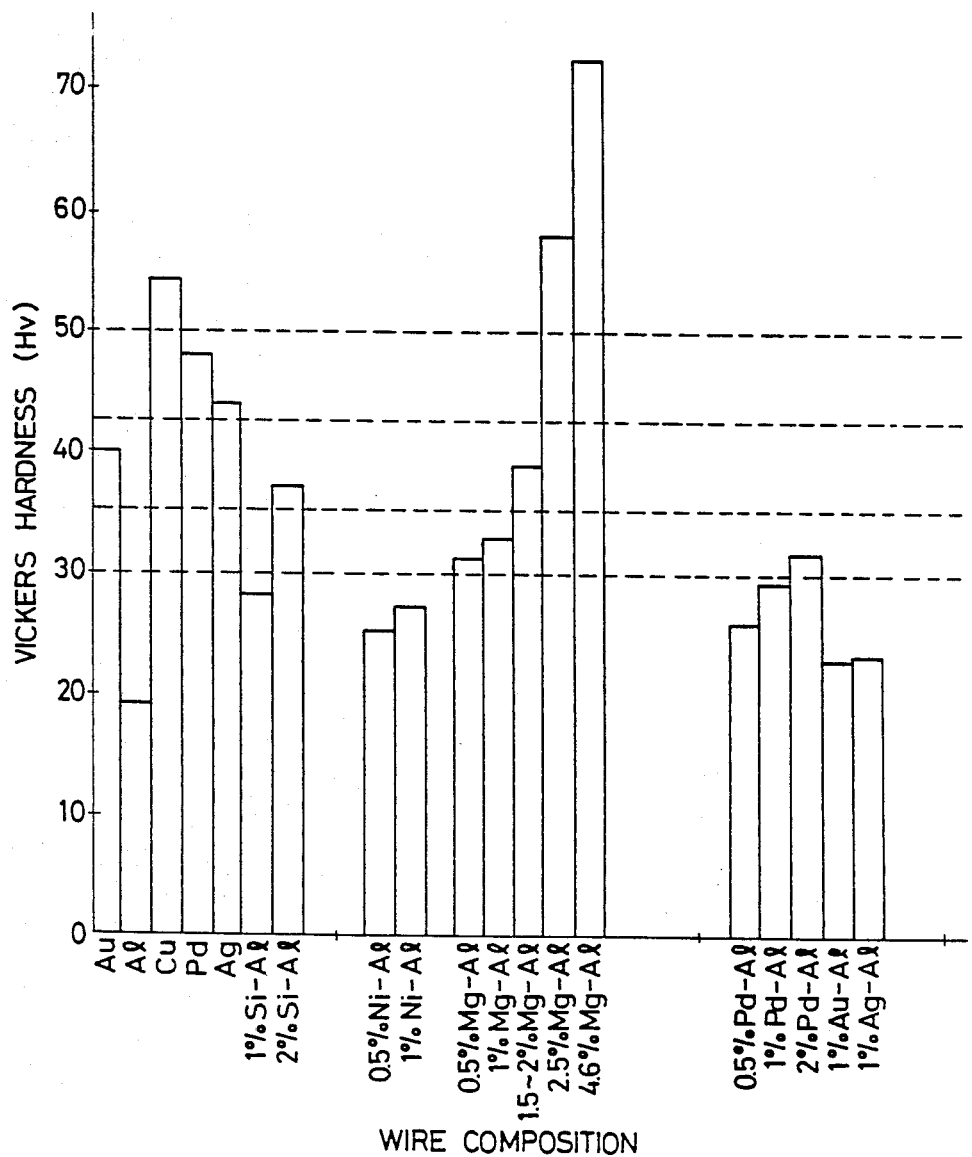
FIG. 9 is a graph showing the relationship between the wire composition and the Vickers hardness of the ball portions of the wires.

In FIG. 9, the vertical axis represents the Vickers hardness while a plurality of bars spaced along the horizontal axis represent the compositions of various material. The Vickers hardness of each material is indicated in such a manner that, for example, the value of Au is 40. In addition, "1% Si-Al" indicates a wire which is made of Al containing 1 weight % of Si and the balance of aluminum, and "Au" indicates a wire which is made of 100% Au.

FIG. 9 indicates that, with a wire of a composition of aluminum containing 2 weight % of silicon (2% Si-Al) or a wire of a composition of aluminum containing 1.5-2 weight % of magnesium (1.5-2% Mg-Al), the wire having the Vickers hardness of 35-42 is obtained, so that favorable aluminum ball bonding is possible.

As a material of which the wire having the Vickers hardness of about 30-50 is produced, one is mentioned which is aluminum containing any of 0.5 weight % of magnesium, 1 weight of magnesium and 2 weight % of palladium. Even with this material, a wire having an acceptable bonding rate, as illustrated in FIG. 8, can be obtained.

Besides the aforementioned hardness of the ball, the hardness of the whole wire affects the bondability and the wire loop shape.

Figure 10:
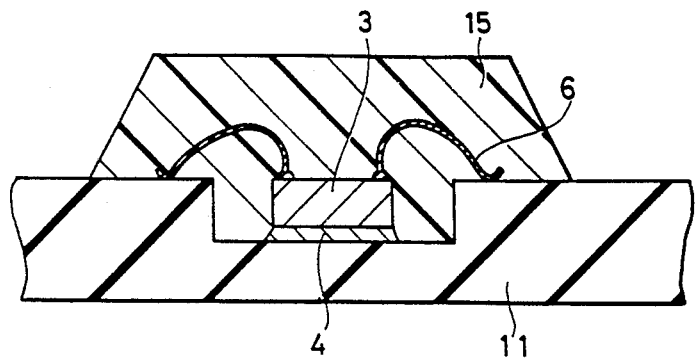
FIG. 10 is a partial sectional view of another embodiment of the semiconductor device according to the present invention.
Figure 11:
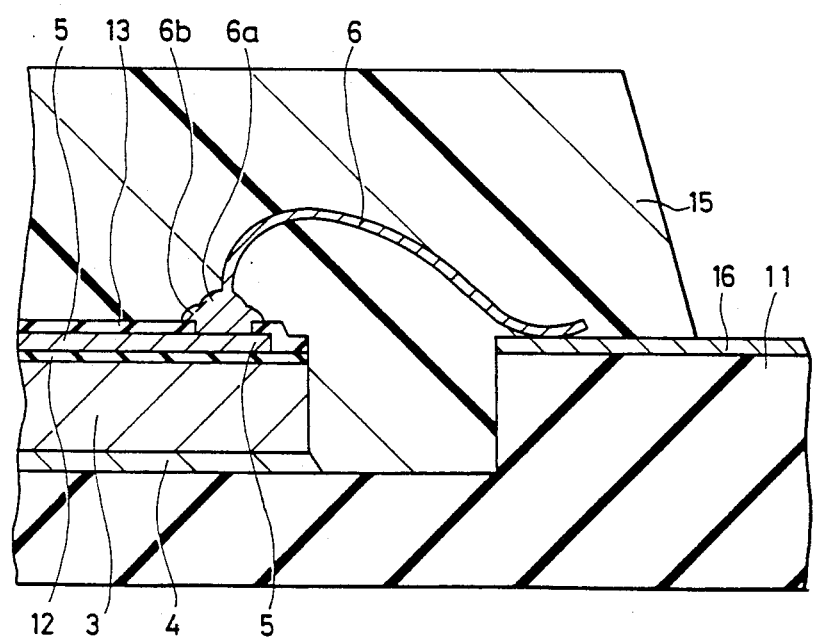
FIG. 11 is an enlarged partial sectional view showing a wire loop in the semiconductor device of FIG. 10.

The control of the shape of a wire loop becomes most important in a thin semiconductor device, for example, one for a timepiece, as shown in FIGS. 10 and 11. A silicon pellet 3 is mounted in the cavity of a base 11 made of an insulating material such as glass epoxy, by a binding material 4, for example, a silver (Ag) paste or gold-silicon (Au-Si) eutectic.

An aluminum bonding pad 5 on the pellet 3 and an electrically conductive layer 16, made of copper or the like and arranged on the base 11 and around the cavity so as to oppose the pellet, are electrically connected with each other by a bonding wire 6 which is made of, e.g., aluminum or an aluminum composition (e.g., alloy) or gold. The conductive layer 16 is an external terminal for electrically connecting the interior and exterior of the pellet 3.

The part of the bonding wire 6 connected to the bonding pad 5 is subjected to ball bonding. After a ball part 6a is formed by the expedient shown in FIG. 3, it is bonded to the bonding pad 5 by the expedient shown in FIG. 4, whereby a bonding part 6b is formed.

The pellet 3 and the wires 6 are encapsulated in a sealing member 15 by the potting, molding or the like of a resin, for example, a polyimide resin or epoxy resin.

Especially in the thin semiconductor device, it becomes very important how the loop height of the bonding wire 6 is maintained at a fixed stable height within the rating thereof while the wire 6 is laid by a wire bonder (not shown). A stated before, a favorable loop height is not attained when the hardness of the wire 6 is too high or too low, and the optimum wire loop height as desired needs to be attained.

The inventors, therefore, conducted experiments and research. As a result, they have found that the wire loop height can be optimally controlled by heat-treating the wire 6 under specified temperature conditions within a continuous annealing furnace (not shown) before the wire bonding of the wire 6. Further, it has been found that the wire loop height can be optimally controlled by recrystallizing the wire 6 when the wire, once softened by the heat treatment, is cooled and hardened again.

Figure 12:
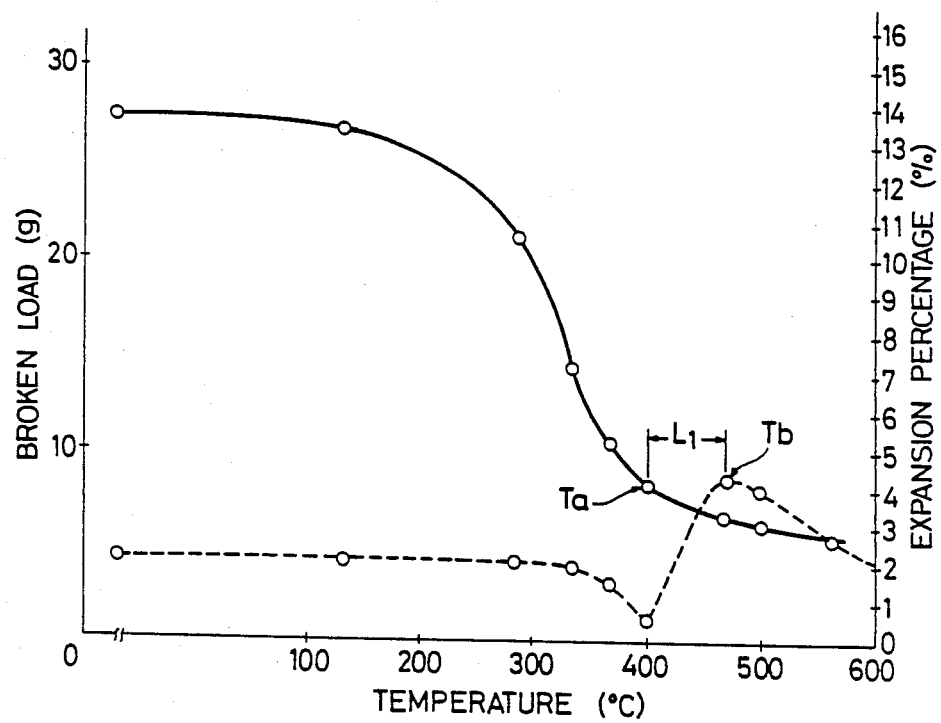
FIG. 12 is graph showing the relationships between the heat treatment temperature of a wire and the breaking load and the expansion percentage.

FIG. 12 shows the relationships of the heat treatment temperature to the breaking load; i.e., the load at break or rupture and the expansion or elongation percentage in the cast where the inventors annealed a wire having a diameter of 30 μm and made of aluminum containing 1 weight % of silicon (1% Si-Al). The annealing was performed by moving a semiconductor device at a speed of 40 cm/min. in the annealing furnace held at a fixed temperature.

In FIG. 12, the axis of abscissas represents the annealing temperature (° C), and the axis of ordinates represents the breaking load (gr.) of the wire and the expansion percentage (%) thereof. Curves indicated by a solid line and a dotted line denote the tensile load (gr.) at the point of breaking or rupture of a wire that had experienced certain annealing temperature and the maximum expansion percentage (%) of the wire before the breakage, respectively.

The wire affording the favorable wire loop height can be obtained by heat-treating the wire in a temperature range which is higher than the recrystallization starting temperature of the wire; namely, the lowest temperature $T_a$ permitting the recrystallization and which is not higher than a temperature $T_b$ maximizing the expansion percentage, that is, in a range which is indicated by $L_1$ in FIG. 12 (about 400°-470° C.). In the illustration, the recrystallization starting temperature $T_a$ is a point of inflexion, and it is about 400° C. in the case of FIG. 12.

The wire annealed at a temperature above the recrystallization starting temperature $T_a$, in other words, the recrystallized wire, provides a good loop shape. The reason will be that the tension of the wire acts on the whole wire and is absorbed reasonably.

As to the wire annealed at a temperature below the recrystallization starting temperature $T_a$, particularly the wire annealed at a temperature in the range in which the expansion percentage curve exhibits a constant value, the loop shape is unfavorable because the height from the bonding plane is too low. Such wire exhibits a great breaking load and has a high strength, but it is prone to break down. The reason why the wire is liable to break down is as stated hereinafter.

The size of the crystal grain of the wire changes abruptly near the ball part 6a. The bonding part 6b, the ball part 6a, and the part of the wire in a range of a height being 2-3 times as great as the height or distance of the ball part 6a from the bonding plane are heated by a temperature of 500°-600° C. for forming the ball part 6a. This temperature is higher than the recrystallization starting temperature of the aluminum wire of any composition. Therefore, the aluminum in these regions has the recrystallization promoted and comes to have a grain diameter of several tens μm. One grain can occupy the section of the wire having a diameter of 30 μm. On the other hand, the aluminum outside these regions underdoes only temperatures lower than the recrystallization starting temperature $T_a$. Accordingly, the grain of the aluminum remains unchanged at that of the raw wire formed by drawing the ingot of aluminum, and it has a diameter not greater than 1 μm.

Meanwhile, the wire erected from the ball part 6a upright substantially vertically is subjected to a lateral tension for forming a loop. This tension concentrates on the part of the wire at which the grain diameter changes abruptly; namely, the part whose height is 2-3 times greater than the height of the ball part 6a from the bonding pad 5. In consequence, the wire breaks.

Further, even with the annealing at the temperature above the recrystallization starting temperature $T_a$, the wire annealed at a temperature above the temperature $T_b$ maximizing the expansion of elongation percentage of the wire is not favorable. Since the whole wire is soft or the expansion percentage is great, the wire loop shape approximates the moving path of the bonding tool 10. Therefore, the maximum height of the loop from the bonding pad 5, which is usually 200-300 μm, becomes as great as 600-700 μm.

The wire annealed at the temperature above the temperature $T_a$ and below the temperature $T_b$ is difficult to break and can afford a proper loop height. The grain diameter of aluminum becomes several μm, for example, 5 μm in the whole wire. Further, the grain diameter decreases gradually, not abruptly, from the part having the grain diameter of several tens μm.

The annealing described above needs to be carried out before performing the wire bonding. It is recommended to carry out the annealing according to the present invention before the wire is prepared on the spool of the wire bonder or the like.

The recrystallization starting temperature $T_a$ and the temperature $T_b$ maximizing the expansion percentage differ depending upon the wire materials.

Figure 13:
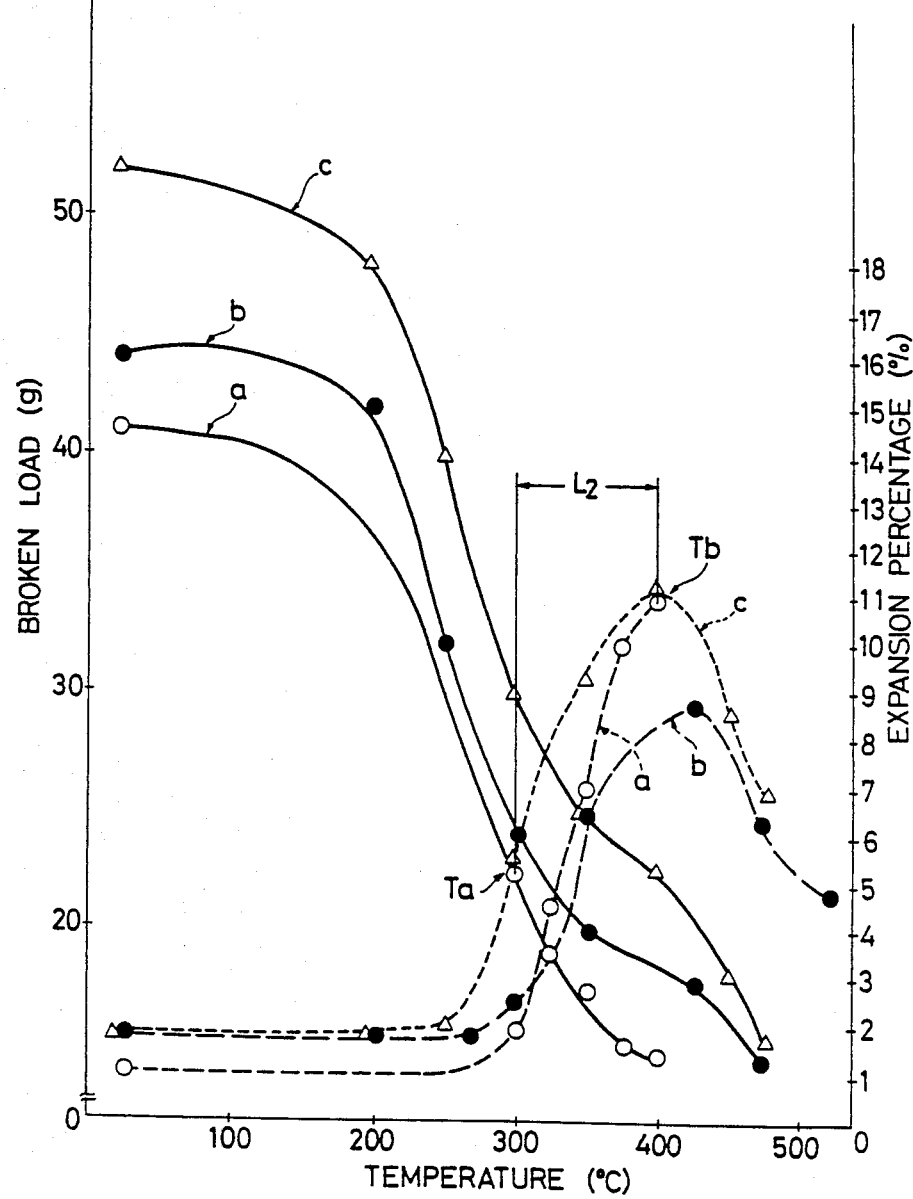
FIG. 13 is a graph showing the relationships of another wire between the heat treatment temperature and the breaking load and the expansion percentage.

FIG. 13 shows the relationships of the heat-treatment temperature to the breaking load and the expansion percentage in the case where the inventors performed continuous annealing treatments (at 40 cm/min.) similar to that of FIG. 12 to a wire of aluminum containing 1.5 weight % of magnesium (1.5 Mg-Al), etc. In FIG. 13, the axis of abscissas and the axis of ordinates represent the same values as in FIG. 12. A solid line and a dotted line indicate the breaking load and the expansion percentage as in FIG. 12, respectively.

A solid line a and a dotted line a correspond to the aforementioned wire of aluminum containing 1.5 weight % of magnesium (1.5% Mg-Al), a solid line b and a dotted line b a wire of aluminum containing 2.9 weight % magnesium (2.9% Mg-Al), and a solid line c and a dotted line c a wire of aluminum containing 4.9 weight % of magnesium (4.9% Mg-Al). All the diameters of these wires are 30 μm.

Quite similarly to the example illustrated in FIG. 12, the range $L_2$ of the optimum annealing temperatures can be set for the wire of aluminum containing 1.5 weight % of magnesium. Since the material of the wire differs, $T_a \approx 300°$ C. and $T_b = 400°$ C. According to this wire, besides the favorable wire loop shape, ball bonding better than with the wire illustrated in FIG. 12 is possible. That is, as illustrated in FIG. 9, this wire can afford the optimum hardness of the ball. It is, therefore, possible to prevent bonding defects such as separation of the bonding wire and cracks due to the bonding.

With the wire of aluminum containing 2.9 weight % of magnesium, the temperature range of annealing becomes 300°-420° C. while the loop shape is kept desirable and the wire strength is held at or above a certain value. In this case, however, the hardness of the wire is great and, hence, a state as good as that of the aluminum wire containing 1.5 weight % of magnesium is not attained. In addition, with the wire of aluminum containing 4.9 weight % of magnesium, a temperature range of annealing as wide as several tens ° C. cannot be set.

In any case, however, a wire having a favorable loop height can be produced by conducting the heat treatment in the temperature range (indicated by $L_2$ in FIG. 13) higher than the recrystallization starting temperature of the wire material and not higher than the temperature maximizing the expansion percentage. That is, the loop shape of the wire can be controlled by recrystallizing the wire.

The material compositions of the wires 6 falling within the optimum hardness range include various examples. As the examples of the compositions of aluminum alloy wires capable of the most favorable ball bonding, there are mentioned aluminum-based compositions, respectively, containing 1.0 weight % of nickel and 0.5 weight % of manganese; 1.0 weight % of nickel and 1.0 weight % of manganese; 0.5 weight % of nickel and 1.0 weight % of manganese; 0.1 weight % of nickel and 1.5 weight % of magnesium; 1.7 weight % of magnesium, 0.3-0.5 weight % of nickel and 0.3 weight % of iron; and 2 weight % of nickel and 1.0-2.0 weight % of silicon.

Based on a study of these experimental results, it has been revealed that Ni is principally contributive to the improvement of the corrosion resistance, while Mg, Mn or Si is principally contributive to the adjustment of the hardness. It has also been revealed that Ni does not adversely affect the effects of the hardness adjustments owing to Mg, etc., while contrariwise, Mg, etc., do not impede the increase of the corrosion resistance owing to Ni. It has also been revealed that Ni and Mg, or Mn and Si coexist stably in Al without adversely affecting the mechanical and electrical characteristics of the wire.

In accordance with the invention disclosed herein, the following effects have been obtained.

Using an aluminum wire which contains at least one element selected from the group consisting of 0.05 to 3.0 weight % of iron and 0.05 to 3.0 weight % of palladium, atomic hydrogen (H) can be checked from entering the wire via the aluminum grain boundary of the wire, by a catalytic action possessed by such element, so that the moisture resistance of the wire can be increased.

Using an aluminum wire which contains at least one element selected from the group consisting of 0.05-3.0 weight % of nickel, 0.05-3.0 weight % of iron and 0.05-3.0 weight % of palladium and at least one element selected from the group consisting of 0.5-3.0 weight % of magnesium, 0.5-3.0 weight % of manganese and 0.05-3.0 weight % of silicon, the mechanical strength of the wire can be increased simultaneously with the moisture resistance thereof, and defects such as disconnection and short-circuit ascribable to the breaking of the wire, the flow of the wire by injection of a resin, etc., can be prevented.

Even when a wire whose principal ingredient is aluminum is applied to a resin-molded semiconductor device, a high reliability can be attained. This makes it possible to effectively utilize the merit of low cost of an aluminum-based wire.

The ball bonding technique of an aluminum wire can be readily applied to a resin-molded semiconductor device.

The breaking strength of a wire after sealing with a package is set at about 6 grams or above for the wire having a diameter of 30 microns, whereby the breaking of the wire is prevented, and the reliability of a product can be enhanced.

The breaking strength of a wire before sealing with a package is set at about 20 grams or above for the wire having a diameter of 30 microns, whereby strengths necessary for wire drawing, etc., can be sufficiently secured, and disconnection can be prevented.

In a case where the material of a wire has been recrystallized, the formation of the wire into a loop can be normally executed and defects such as short-circuit can be prevented while still maintaining sufficient breaking strength.

By properly selecting the material or composition of a wire, the breaking strength of the wire can be set at a predetermined value or above, and besides, the corrosion resistance and mechanical strength of the wire can be enhanced.

Since aluminum wire contains nickel and the ball portion thereof has a Vickers hardness of 35-45, the corrosion resistance of the wire can be increased, and moreover, the bonding strength of the wire can be sufficiently secured and the excess collapse of the ball portion as well as any damage to a bonding pad can be prevented, so that the reliability is enhanced.

Since a wire contains aluminum as its principal ingredient, it can sharply reduce cost as compared with a gold wire.

The ball bonding of a wire whose principal ingredient is aluminum can be performed stably and easily, and the feature of low cost which is on of the merits of the aluminum-based wire can be exploited.

The working of a wire whose principal ingredient is aluminum can be facilitated by a proper ball hardness.

By selecting the hardness of an aluminum ball part in a specified range, the bonding property and the bonding strength with an aluminum wire can be remarkably enhanced.

A wire which is excellent in bondability and which is also excellent in the corrosion resistance, the mechanical strength and the breaking strength can be provided by properly selecting the composition of the aluminum wire.

By quenching a wire after forming its end with a ball part, the ball part having a predetermined hardness is obtained, so that favorable wire bonding can be performed.

The loop shape of a wire can be controlled in such a way that the wire softened by heat treatment is recrystallized before wire bonding.

The loop height of a wire can be rendered the optimum height by heat-treating the wire in a temperature range higher than the recrystallization starting temperature of the wire and not higher than a temperature maximizing the expansion percentage of the wire.

When a wire is an aluminum wire containing 1 weight % of silicon or 1.5 weight % of magnesium, a favorable loop height within the rating of the loop height can be attained.

Owing to the control of a wire loop shape by a heat treatment, the occurrence of the flaw of a wire due to a back tension is preventable, and an inferior external appearance ascribable to an improper wire loop is preventable.

By specifying a wire composition, a ball of a hardness suited to bonding can be formed and, moreover, a wire loop height can be rendered the optimum value.

When a heat treatment is conducted at a specified temperature corresponding to a wire so as to render the hardness of the ball of the wire at a value suitable for bonding, a bonding wire with high bondability and good loop shape is realized.

It will be appreciated that the present invention, as heretofore described in conjunction with specific embodiments, is not restricted to these embodiments and the invention may be variously altered within a scope not departing from that set forth in the appended claims.

For example, the material composition of a wire is not restricted to those specifically heretofore mentioned, but various other compositions can be employed. For example, a wire may well be an Au wire, etc., besides the Al-based wire.

The breaking strength of a wire changes depending upon the diameter thereof. In this regard, the present invention is not restricted only to a wire having a diameter of 30 microns, but it extends also to wires of different diameters by equalizing the breaking strength per unit area.

An aluminum wire according to the present invention is effective, not only when executing the ball bonding, but also in case of the ordinary ultrasonic bonding employing a wedge.

With a wire which has been recrystallized by annealing it at temperatures in a range, for example, from the recrystallization point of an aluminum alloy to this recrystallization point plus 150° C., the normal looping free from the bend of the wire is ensured more.

The preferable hardness of a ball part can also be attained by gradual cooling after the formation of the aluminum ball, not only by quenching based on air cooling.

In addition, a favorable bonding property can be enhanced by varying the thickness of the aluminum film of an aluminum pad.

Heretofore, the invention made by the inventors has been chiefly described concerning the case where it is applied to a semiconductor device employing a resin-molded semiconductor device employing ball bonding of aluminum-based wires based on ultrasonic bonding, which forms the background field of utilization thereof. However, the invention is not restricted to such a semiconductor device, but it is extensively applicable to semiconductor devices employing various packages, for example, ones of the surdip type, the laminated ceramic type and the chip carrier type, as long as a wire containing aluminum as its principal ingredient is used.

Regarding the wire bonding system, the invention is extensively applicable to thermocompression and other various systems, besides the ultrasonic bonding. The present invention is applicable to any semiconductor device in which, at least, a semiconductor pellet and an external terminal for connecting this pellet and the exterior are connected by the use of a wire.

While we have shown a described several embodiments in accordance with the present invention, it is understood that the same is not limited thereto but is susceptible of numerous changes and modifications as known to one having ordinary skill in the art, and we therefore do not wish to be limited to the details shown and described herein, but intend to cover all such modifications as are encompassed by the scope of the appended claims.

What is claimed is:

1. A semiconductor device comprising:
   (a) a semiconductor pellet having a plurality of bonding pads formed on one of the major surfaces thereof;
   (b) external conductive portions extending outside the pellet;
   (c) bonding wires containing aluminum as their principal ingredient, one end of each of which has been connected to the respective bonding pads through a ball formed at the one end thereof, so as to provide a ball bond between the wire and respective bonding pad, and the other end of each of which has been connected to the respective conductive portions through wedge bonding to provide a wedge bond between the wire and respective conductive portion;
   said each wire being formed of an aluminum alloy consisting essentially of aluminum and 0.05–3.0 weight % of a first element consisting of nickel, and 0.5–30. weight % of at least one second element selected from the group consisting of magnesium and manganese, such that said ball has a Vickers hardness of 35–45, whereby corrosion resistance, as well as mechanical strength, of the wire is improved, as compared to that of a wire formed of aluminum without the first element and the at least one second element, and whereby improved bonding of the ball bond without damage to the underlying bonding pad, as compared to that of a wire having a ball with a Vickers hardness outside the range of 35–45, is achieved.

2. A semiconductor device according to claim 1, wherein said semiconductor device is molded within a resin.

3. A semiconductor device according to claim 1, wherein the first element nickel is present in an amount of at least 0.075 weight %.

4. A semiconductor device according to claim 3, wherein said semiconductor device is molded within a resin.

5. A semiconductor device comprising:
   (a) a semiconductor pellet having a plurality of bonding pads formed on one of the major surfaces thereof;
   (b) external conductive leads disposed outside the pellet;
   (c) bonding wires of an aluminum alloy, one end of each of which has been connected to the respective bonding pads through a ball formed at the one end thereof, so as to provide a ball bond between each bonding wire and the respective bonding pad, and the other end of each of which has been connected to the respective conductive leads by wedge bonding so as to provide a wedge bond between the other end of each bonding wire and the respective conductive lead; the aluminum alloy containing nickel and also containing at least one of magnesium or manganese so as to provide a Vickers hardness of 35–45 at the ball portion thereof, whereby corrosion resistance, as well as mechanical strength, of the wire is improved, as compared to that of a wire formed of aluminum without the first element and the at least one second element, and whereby improved bonding of the ball bond without damage to the underlying bonding pad, as compared to that of a wire having a ball with a Vickers hardness outside the range of 35–45, is achieved.

6. A semiconductor device according to claim 5, wherein nickel is contained in an amount of at least 0.075 weight %.

7. A semiconductor device according to claim 6, wherein said each wire also contains 0.5–3.0 weight % of at least one element selected from the group consisting of magnesium and manganese.

8. A semiconductor device according to claim 7 wherein said each wire contains 1.0 weight % of nickel, 0.5 weight % of manganese and a balance of aluminum.

9. A semiconductor device according to claim 7, wherein said each wire contains 1.0 weight % of nickel, 1.0 weight % of manganese and a balance of aluminum.

10. A semiconductor device according to claim 7, wherein said each wire contains 0.5 weight % of nickel, 1.0 weight % of manganese and a balance of aluminum.

11. A semiconductor device according to claim 7, wherein said each wire contains 1.7 weight % of magnesium, 0.5 weight % of nickel and a balance of aluminum.

12. A semiconductor device according to claim 7, wherein said each wire contains 2 weight % of nickel.

13. A semiconductor device according to claim 8, wherein said each wire contains 2 weight % of nickel.

14. A semiconductor device according to claim 7, wherein said each wire contains 0.1 weight % of nickel and 1.5 weight % of magnesium.

15. A semiconductor device according to claim 5, wherein the other end of each of the bonding wires is connected to the respective conductive portions by wedge bonding.

16. A semiconductor device comprising:
(a) a semiconductor pellet;
(b) a plurality of bonding pads formed on a first major surface of the semiconductor pellet;
(c) a plurality of conductive lead members, each one of which plurality of lead members has an end portion which is disposed outside of the semiconductor pellet in the vicinity of a respective one of the bonding pads; and
(d) a plurality of bonding wires, one end of each of which plurality of bonding wires is connected to a respective bonding pad by a ball bond, said ball bond being provided with ball portions at said one end of each of the plurality of bonding wires, each of the ball portions being ball portions formed at said one end of each of the plurality of bonding wires by an electric discharge at said one end of each of the plurality of bonding wires, each ball portion being of Vickers hardness of 30 to 50, the ball bond being a bond formed by ultrasonic bonding of the ball portion to the respective bonding pad, and the other end of each of which plurality of bonding wires is connected to the end portion of a respective conductive lead member in the vicinity of the respective one of the bonding pads, so as to provide each of the bonding wires in a wire loop shape,
said plurality of bonding wires each consisting essentially of a material selected from the group consisting of aluminum and aluminum alloy, said plurality of bonding wires being bonding wires formed by heat treating wires for forming the bonding wires, the that treating being performed at a temperature higher than the recrystallization starting temperature of the wire and at most the temperature maximizing the expansion percentage, so as to provide each of the bonding wires with the proper wire loop shape.

17. A semiconductor device according to claim 16, wherein each ball portion has a Vickers hardness of 35 to 45.

18. A semiconductor device according to claim 16, wherein the bonding wires has an aluminum alloy grain structure, the grain structure changing in size at most only gradually along the length of the wires such that wire breakage, due to a lateral tension on the wire upon forming the wire loop shape, is avoided.

19. A semiconductor device according to claim 1, wherein the first element consisting of Ni is contained in the aluminum alloy in an amount of 0.075–3.0 weight %.

20. A semiconductor device according to claim 1, wherein said at least one second element is magnesium.

21. A semiconductor device according to claim 1, wherein the aluminum alloy consists essentially of aluminum and 1.0 weight % of Ni and 0.5 weight % of Mn.

22. A semiconductor device according to claim 1, wherein the aluminum alloy consists essentially of aluminum and 1.0 weight % of Ni and 1.0 weight % of Mn.

23. A semiconductor device according to claim 1, wherein the aluminum alloy consists essentially of aluminum and 0.5 weight % of Ni and 1.0 weight % of Mn.

24. A semiconductor device according to claim 1, wherein the aluminum alloy consists essentially of 0.1 weight % of Ni and 1.5 weight % of Mg.

25. A semiconductor device according to claim 1, wherein Ni is contained in the aluminum alloy in an amount in the range of from 0.05 to less than 0.20 weight % and from more than 1.60 to 3.0 weight %; and wherein said at least one second element is contained in the aluminum alloy in an amount of 0.5–3.0 weight %, except for 1.0 weight %, where said at least one second element is Mn, and is contained in the aluminum alloy in an amount of more than 1.0 to 3.0 weight %, except for 2.0 weight %, where said at least one second element is Mg.

26. A semiconductor device according to claim 25, wherein Ni is contained in the aluminum alloy in an amount in the range of from 0.075, to less than 0.20, weight %.

* * * * *